United States Patent
Lerner et al.

(10) Patent No.: US 12,021,486 B2
(45) Date of Patent: *Jun. 25, 2024

(54) SYSTEMS AND METHODS FOR APPLYING FLEXIBLE SOLAR PANELS TO FLEXIBLE UNDERLYING MEMBRANES

(71) Applicant: Pvilion, Inc., Brooklyn, NY (US)

(72) Inventors: Robert Lerner, Brooklyn, NY (US); Todd Dalland, Brooklyn, NY (US); Colin Touhey, Brooklyn, NY (US)

(73) Assignee: Pvilion, Inc., Brooklyn, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/480,584

(22) Filed: Sep. 21, 2021

(65) Prior Publication Data
US 2022/0368279 A1 Nov. 17, 2022

Related U.S. Application Data

(63) Continuation of application No. 16/163,659, filed on Oct. 18, 2018, now Pat. No. 11,128,254, which is a continuation of application No. 14/739,055, filed on Jun. 15, 2015, now Pat. No. 10,110,161.

(60) Provisional application No. 62/011,997, filed on Jun. 13, 2014.

(51) Int. Cl.
*H02S 30/20* (2014.01)
*H01L 31/042* (2014.01)
*H01L 31/048* (2014.01)
*H02S 20/00* (2014.01)

(52) U.S. Cl.
CPC ............ *H02S 30/20* (2014.12); *H01L 31/042* (2013.01); *H01L 31/048* (2013.01); *H02S 20/00* (2013.01); *Y02B 10/10* (2013.01); *Y02E 10/50* (2013.01); *Y10T 29/49119* (2015.01)

(58) Field of Classification Search
CPC ................................ H02S 30/20; H02S 20/00
See application file for complete search history.

(56) References Cited

U.S. PATENT DOCUMENTS

| | | | | |
|---|---|---|---|---|
| 2,853,758 A | * | 9/1958 | Topf | A41F 1/00 2/2.17 |
| 2007/0062567 A1 | * | 3/2007 | Warner | E04H 15/644 135/97 |
| 2011/0277809 A1 | * | 11/2011 | Dalland | F24J 2/523 136/244 |

FOREIGN PATENT DOCUMENTS

WO  WO-2013162376 A1 * 10/2013 ............. E04H 15/18

OTHER PUBLICATIONS

"Tension structure connection details," Fabric Architecture magazine, Jan. 2010, , retrieved from archive.org and saved as early as Jul. 15, 2010. (Year: 2010).*

* cited by examiner

*Primary Examiner* — Angelo Trivisonno
(74) *Attorney, Agent, or Firm* — Kramer Levin Naftalis & Frankel LLP (57) ABSTRACT

Systems and methods for applying flexible solar panels to flexible underlying membranes are disclosed. The embodiments disclosed herein involve systems and methods for applying flexible photovoltaic modules to flexible underlying membranes, including large and small span and permanent membrane structures.

5 Claims, 7 Drawing Sheets

SYSTEMS AND METHODS FOR APPLYING FLEXIBLE SOLAR PANELS TO FLEXIBLE UNDERLYING MEMBRANES

CROSS-REFERENCE TO RELATED APPLICATIONS

This application claims the benefit of U.S. Provisional Patent Application No. 62/011,997, filed Jun. 13, 2014, which is incorporated by reference herein in its entirety.

BACKGROUND OF THE DISCLOSURE

Photovoltaic modules can convert solar energy into electricity through the photovoltaic effect, which is a process by which the energy contained in photons is converted into electrical current. Photovoltaic cells are typically formed of a semiconductor, such as silicon. The semiconductor lattice can absorb received photons, thereby releasing bound electrons and producing electric current. When silicon is used as a light absorbing material in a photovoltaic module, it can be in bulk, crystalline form or in a thin film of amorphous silicon. Additionally, other non-silicon based materials such as cadmium-indium-gallium-(di)selenide ("CIGS") and cadmium telluride ("CadTel"), for example, can be used to create the photovoltaic effect.

Photovoltaic cell modules have been mounted atop structures designed to shade parking areas while at the same time generating electricity. Generally, such structures are permanent installations constituting real property and form a single structure or building covering several parking spaces in a parking lot. Such structures are often arranged in rows parallel to and above rows of parking spaces. These structures may alternatively be deployed and utilized as electric vehicle recharging stations. The erection of such structures is a significant site construction project often requiring building permits.

Additionally, where steel framing is utilized, assembly and erection have been directed to permanent installation using primarily welded joints in the assembly of the frame. Where parking lots exhibit varying surface elevation or unusual or irregular plan layouts, additional expense is incurred in customizing and building out such structures over a row or group of parking spaces because either the structure itself must be conformed to the varying terrain level or unusual or irregular plan layout, or costly grading and earth moving may be required to accommodate horizontal foundations of the structure.

Flexible solar modules have been laminated onto roof surfaces, walls, and fabric structures. The photovoltaic cells typically contain amorphous silicon or other materials such as copper indium gallium selenide (GIGS), and the cells are deposited onto flexible substrates. Such flexible solar modules are typically laminated onto standing seam metal roofs. Flexible solar panels have been used in the recent past to make photovoltaic tents and solar arrays. These structures have, to date, been limited to small temporary and permanent structures.

SUMMARY OF THE DISCLOSURE

Systems and methods for applying flexible solar panels to flexible underlying membranes are disclosed. The embodiments disclosed herein involve systems and methods for applying flexible photovoltaic modules to flexible underlying membranes, including large and small span and permanent and temporary membrane structures.

In some embodiments, a flexible photovoltaic ("PV") array includes a PV membrane, flexible PV panels coupled to the PV membrane, and at least one tensioning member coupled to an edge of the PV membrane. The PV panels can be coupled to the PV membrane, using an adhesive, for example. Each tensioning member attached to the flexible PV array can include a keder grommet strip, a PV membrane grommet strip permanently affixed to the respective edge of the PV membrane, a main strip permanently affixed between the PV membrane grommet strip and the keder grommet strip (e.g., using heat welds or by virtue of the strips being integrally formed). Each tensioning member can also include a keder permanently affixed to the keder grommet strip and/or grommets provided on each of the PV membrane grommet strip and the keder grommet strip. A keder can be formed along at least one edge of the PV membrane for coupling the flexible PV array to an underlying membrane or to an adjacent flexible PV array. Still further, the flexible PV array can include wiring communicatively coupled to each of the flexible PV panels and fabric loops and/or fabric pockets receiving the wiring.

In some embodiments, a photovoltaic PV system can include a flexible underlying membrane, keders permanently affixed to the flexible underlying membrane, and flexible PV arrays including one or more tensioning members permanently affixed to edges thereof. The system can also include keder rails slidably attached to keders of the tensioning members and the keders affixed to the flexible underlying membrane. The keder rails can thereby couple a flexible PV array to the flexible underlying membrane and/or to adjacent flexible PV arrays. The flexible underlying membrane can have a doubly curved topology, and the keder rails can follow geodesic lines of curvature on a surface of the flexible underlying membrane. Further, the tensioning members can include a keder grommet strip permanently affixed to a keder, a PV membrane grommet strip permanently affixed to a the edge of the flexible PV array, grommets on each of the keder grommet strip and the PV membrane grommet strip, at least one of a rope and a cable laced through the grommets for tightening the flexible PV array to which each tensioning member is coupled, against the flexible underlying membrane.

In some embodiments, a method is provided for applying a flexible PV array, to a flexible underlying membrane, including coupling tensioning members to edges of the flexible PV array, coupling at least one keder to the flexible underlying membrane, and sliding keder rails over the at least one keder coupled to the flexible underlying membrane and keders of the tensioning members. The method can also include lacing together grommets of each tensioning member to tension the flexible PV array against the flexible underlying membrane and/or coupling flexible PV panels to a PV membrane to form the flexible PV array. The method can further include coupling the flexible PV panels to the PV membrane by applying an adhesive to a back surface of each of the flexible PV panels, contacting the back surface of each of the flexible PV panels to the PV membrane, and/or placing the PV membrane on a vacuum table before contacting the back surface of each of the flexible PV panels to the PV membrane. Still further, the method may include applying pressure to the flexible PV panels after contacting the back surface of each of the flexible PV panels to the PV membrane.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which.

DETAILED DESCRIPTION OF THE DISCLOSURE

Mounting flexible photovoltaic modules on flexible substrates offers numerous advantages. For example, the systems and methods disclosed herein allow flexible photovoltaics to be retrofit onto an existing membrane roof without introducing significant stresses onto that membrane. Further, the photovoltaic skin may be removed after installation for servicing without requiring dismantling of the main membrane roof and without causing any damage to the main membrane roof. An additional advantage of the system is that the warrantees provided for the main membrane roof may not be affected by the application of this removable, non-wind loaded PV surface.

Figure 1:
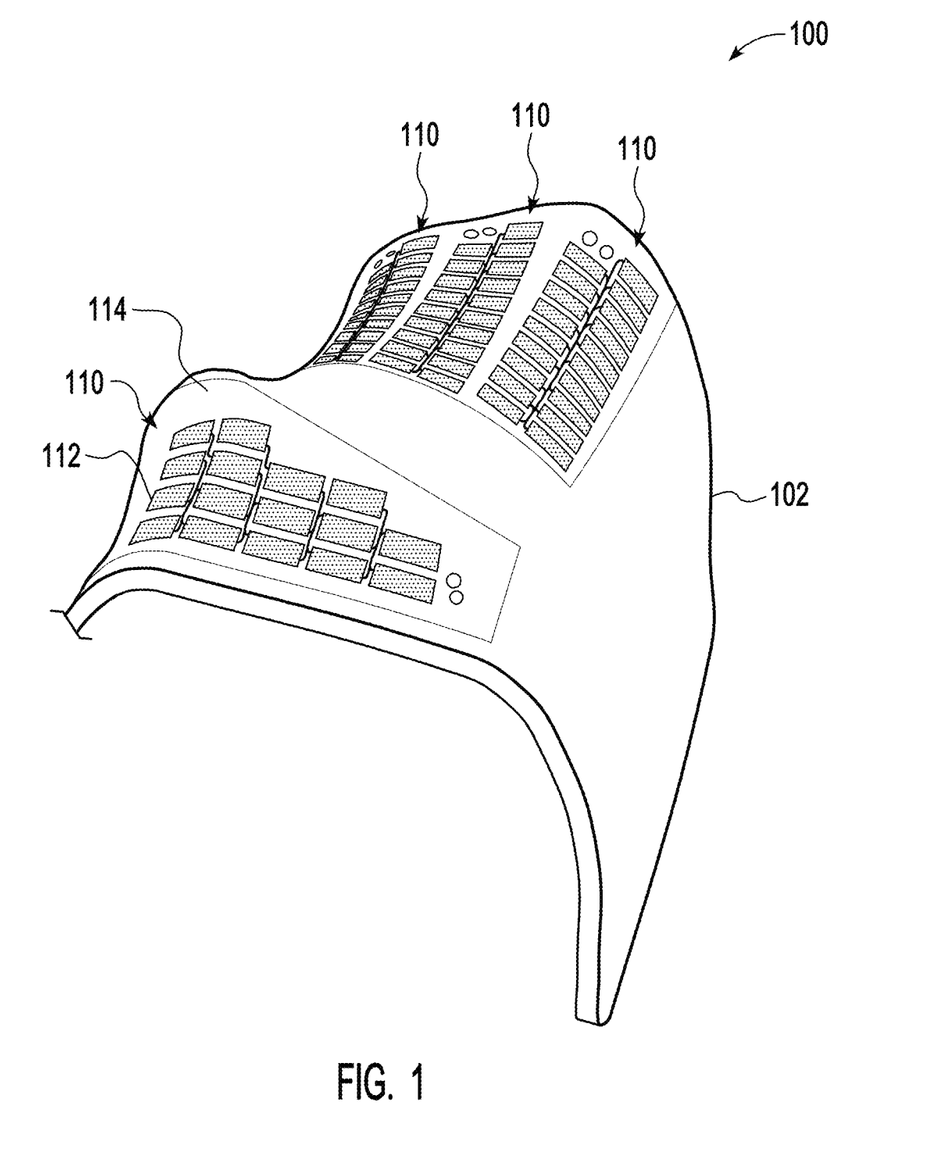
FIG. 1 depicts a perspective view of a flexible photovoltaic ("PV") system, in accordance with various embodiments.

FIG. 1 depicts a perspective view of flexible photovoltaic ("PV") system 100, in accordance with various embodiments. Flexible PV system 100 includes flexible PV arrays 110, including flexible PV panels 112 mounted on PV membrane 114. Flexible PV arrays 110, in turn, are mounted on flexible underlying membrane 102. In particular, FIG. 1 depicts flexible PV arrays 110 onto a tensioned membrane roof (flexible underlying membrane 102). The use of keders, keder rails, double grommet strips with air-seal strip, described in detail below, can help to prevent flexible PV arrays 110 from being pulled from the main roof, since large volumes of air cannot flow underneath the photovoltaic skin. In download, the photovoltaic skin simply presses against the main roof.

Flexible PV panels 112 may be mounted on PV membrane 114 using one or more adhesives and chemical agents in order to bond the back surface of flexible PV panel 112 with the top surface of an industrial fabric that forms PV membrane 114. Flexible PV panels 112 may be coupled to PV membrane 114 using a suitable adhesive (e.g., butyl or acrylic foam tape type adhesives), lamination, combinations thereof, or the like. Closed cell acrylic adhesives demonstrate particularly good high temperature performance. Within the general class of adhesives, 3M RP45 adhesive used in combination with 3M 94 adhesive promoter yielded the particularly good adhesion under both load and temperature cycle tests. This combination resulted in an adhesive surface area of 2 square inches to hold a deadload of 4 lbs at temperatures up to 140 degrees F. It should be understood, however, that other adhesives now known or later developed may be used to adhere flexible PV panels 112 to PV membrane 114. In some embodiments, PV membrane 112 can be laid out upon a vacuum table to ensure that the fabric is held flat during application of flexible PV panels 112. In these and further embodiments, pressure may be applied during application of PV panels 112 (e.g., with a roller) to ensure performance of the adhesive bond.

PV membrane 114 may be formed from any suitable industrial textile that is capable of withstanding exposure to the elements such as sun, wind, rain, snow, and ice, for example, while under tension. Examples of appropriate industrial textiles may include, without limitation, vinyl coated polyester, TEFLON® coated fiberglass, or ETFE film.

Advantageously, flexible PV arrays 110 may be assembled off site. Because flexible PV panels 112 and PV membrane 114 are flexible and extremely light, transportation of flexible PV arrays 110 from an off-site location to the installation site is easy and inexpensive, especially relative to traditional solar panel mounting systems, which typically require heavy, rigid solar panels, long and rigid mounting rails and posts, and a great deal of mounting hardware. Such off-site assembly may even include pre-wiring flexible PV panels 112 so that the only major installation step required to be completed on-site is attaching flexible PV arrays 110 to flexible underlying membrane 102.

As described in detail below with respect to FIGS. 2-4, flexible PV array 110 may be provided with one or more tensioning assemblies 120 for coupling the modules to flexible underlying membrane 102. Flexible PV arrays 110 may be attached to flexible underlying membrane 102 on site such that the membrane structure below the photovoltaic sheet is not subjected to appreciably increased or eccentric wind loading in either uplift or download cases. Additionally, flexible PV array 110 may be secured to flexible underlying membrane 102 in a manner that it follows the main roof shape without appearing slack or having fabric wrinkles that could shade the photovoltaic modules, despite potential mismatches between their respective topologies.

To achieve all of the above, tensioning assemblies 120 may be utilized that restrict the flow of air beneath the flexible PV arrays 110 while also allowing for the modules to be prestressed and sealed from ingress water between flexible PV arrays 110 and flexible underlying membrane 102.

Figure 2:
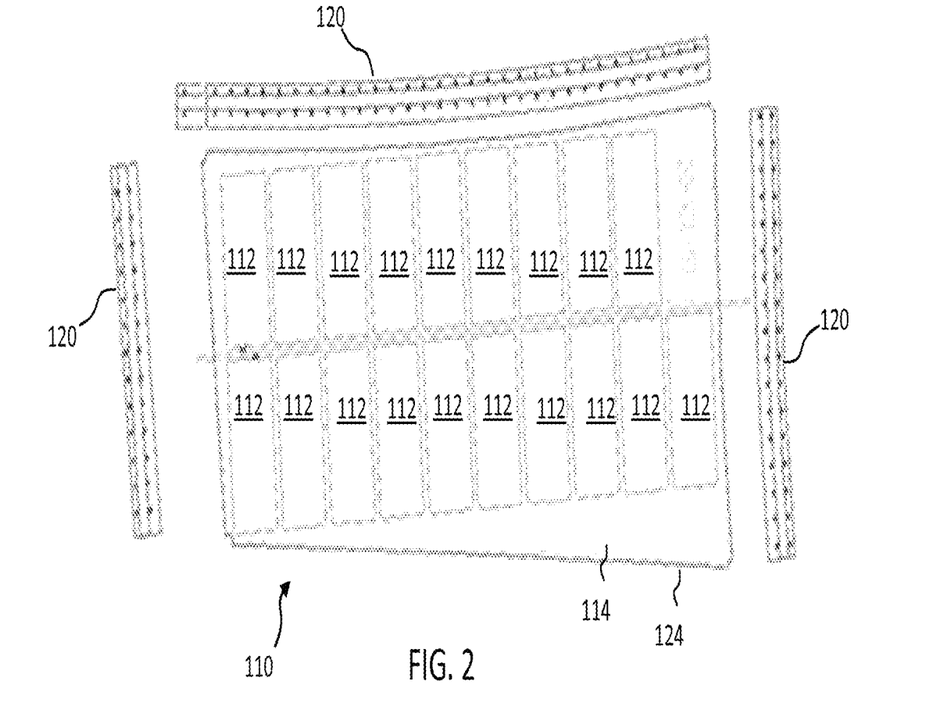
FIG. 2 depicts an exploded schematic view of a flexible PV array, in accordance with various embodiments.
Figure 3:
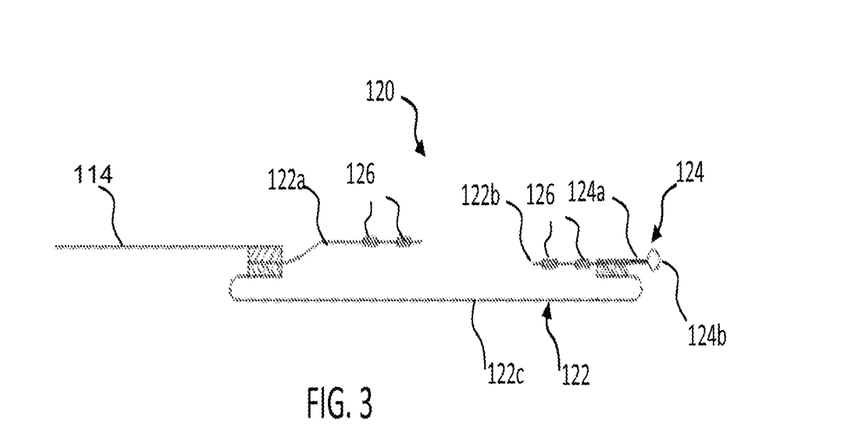
FIG. 3 depicts a cross-sectional view of a tensioning assembly, in accordance with some embodiments.

FIG. 2 depicts an exploded schematic view of flexible PV array 110, in accordance with various embodiments. Flexible PV array 110 can include flexible PV panels 112 mounted to PV membrane 114 as described above with respect to FIG. 1. Additionally, tensioning assemblies 120 for coupling flexible PV array 110 to a flexible underlying membrane are provided. FIG. 3 shows a cross-sectional view of tensioning assembly 120.

One or more tensioning assemblies 120 may be heat welded, or otherwise permanently affixed, to one or more edges of the PV membrane 114. Tensioning assemblies 120 can be formed from one or more strips 122a-c (referred to collectively as strip 122) of industrial fabric having a longitudinal dimension arranged substantially parallel to the edges of flexible PV array 110 and a transverse dimension arranged substantially perpendicular to the longitudinal dimension, as installed. Strip section 122 a-c can include PV membrane grommet strip 122a, which may be heat welded, or otherwise permanently affixed to an edge of PV membrane 114, keder grommet strip 122b, which may be heat welded, or otherwise permanently affixed to keder 124, and main strip 122c, which may be heat welded, or otherwise permanently affixed between PV membrane 114 and keder 124. In some embodiments, strip 122 can be formed from three distinct strips while in other embodiments strip 122 can be folded over at or close to the location of the welded couplings to result in the three distinct sections of strip 122. Main strip 122c facilitates connection between two skins, here flexible underlying membrane 102 and PV membrane 114, without allowing a large open zone for air to flow through. This feature can help reduce the ingress of moisture underneath PV membrane 114 as well as potential wind loading issues that can occur if air is permitted to flow between PV membrane 114 and flexible underlying membrane 102.

PV membrane grommet strip 122a and keder grommet strip 122b can include double rows of grommets 126 that can be used to tighten PV membrane 114 once it is installed onto the flexible underlying membrane 102. In particular, grommets 126 can be provided on PV membrane grommet strip 122a and keder grommet strip 122b and run substantially the length of the longitudinally-oriented edges of strip 122. Double rows of grommets 126 can facilitate a higher degree of tensioning variability for flexible PV array 110 compared with, for example, a single row of grommets on each of the grommet strips. However, any suitable grommet arrangement (e.g., one row, three or more rows, and/or staggered rows) may be employed. Once PV array 110 is installed, it can be tensioned against flexible underlying membrane 102 by lacing grommets 126 with a rope, cable, or other suitable tensioning member.

Tensioning assemblies 120 may also be coupled to the underlying membrane (e.g., flexible underlying membrane 102 of FIG. 1). To accomplish this task, the side of strip 122 not coupled to PV membrane 114 can include keder 124. A "keder" is a device that includes a resilient member (e.g., core 124b in FIG. 3), such as extruded rubber, for example, that is secured in a fabric pocket. The fabric pocket may be formed from a strip of fabric that is folded upon itself and welded shut, for example. One or more sections of the fabric can remain unfolded, forming a "keder flag" or "keder flags" (e.g., keder flag 124a of FIG. 3). Keders can be slipped into retaining sections of a "keder rail" (not shown in FIGS. 2 and 3), which may be an aluminum or plastic extrusion, for example.

To date, keder extrusions and rails have been used in clearspan tent systems in which a fabric roof has no curvature in its surface in which the fabric is flat, like an ordinary roof. In these systems, the keders and keder rails are placed above support beams as a means of joining fabric panels together. In the systems described herein, however, the keder rails can be used as an element to join flexible PV arrays on surfaces with complex topologies (e.g., doubly curved surfaces). The keder rails, therefore, are used in an altogether novel way: that is to say, the keder rails need not be straight and rigid, nor do the keder rails require support from an underlying structural beam. Rather, the keder rails are permitted to curve 3-dimensionally, where necessary, to follow geodesic lines of curvature on the membrane's surface.

This approach allows for "seaming" of complex fabric patterns in the field, for example on the roof of an existing membrane structure. Thus, in some embodiments, flexible PV arrays 110 may not only be coupled directly to the underlying membrane, but rather adjacent flexible PV arrays 110 may be coupled, or seamed, to one another to cover large, complexly shaped membranes. Indeed, using this arrangement and as described in more detail below with respect to FIGS. 6 and 7, flexible PV arrays may be seamed together to form a main membrane without being coupled to an underlying flexible membrane.

Seaming together multiple flexible PV arrays provides several conspicuous advantages. For example, this approach facilitates using keder rails to join several flexible PV arrays together in the field after various manufacturing, packaging, shipping and preparation processes are complete. Thus, instead of heat welding several PV arrays together early in the fabrication process, which is typical for tensile structure manufacturing, they may instead be seamed together easily on site.

One downside of the typical process is that after the flexible PV membranes are joined together in the factory using heat welding equipment, the fabric surface is no longer flat: the curved fabric panel edges create a large, doubly-curved tent surface when joined. It then becomes a significant challenge to adhere the PV's onto the fabric surface, move the atypically heavy, bulky and fragile PV/fabric assembly around the factor for the remainder of the fabrication operations, pack it into crates, and unpack it on site. Furthermore, if the flexible PV arrays are bent and creased, during manufacturing or shipping, for example, they may no longer function. Additionally, PV panels decouple from the PV membrane if mishandled. By using keder rails to seam together flexible PV arrays, on the other hand, as in this further embodiment, the individual flexible PV arrays may be fabricated, packaged, and shipped before joining them into a large, complex surface. This way, the entire manufacturing, shipping, and site preparation process may involve working on relatively small, flat fabric panels instead of large, unwieldy, complexly shaped ones.

In some embodiments, tensioning members 120 might not be provided on every edge of PV membrane 114. Rather, one or more edges may be finished with a keder edge. In FIG. 3, for example, one edge is finished with keder 124 instead of a tensioning member. In the event that an edge of PV membrane 114 is finished with a keder (and without a tensioning member), the end of the fabric can be folded and welded to form the pocket for core 124b such that the main portion of PV membrane 114 forms keder flag 124a. In other embodiments, keder 124 may be a discrete component couplable to PV membrane 114 by heat welding or otherwise permanently affixing keder flag 124a to PV membrane 114.

Figure 4:
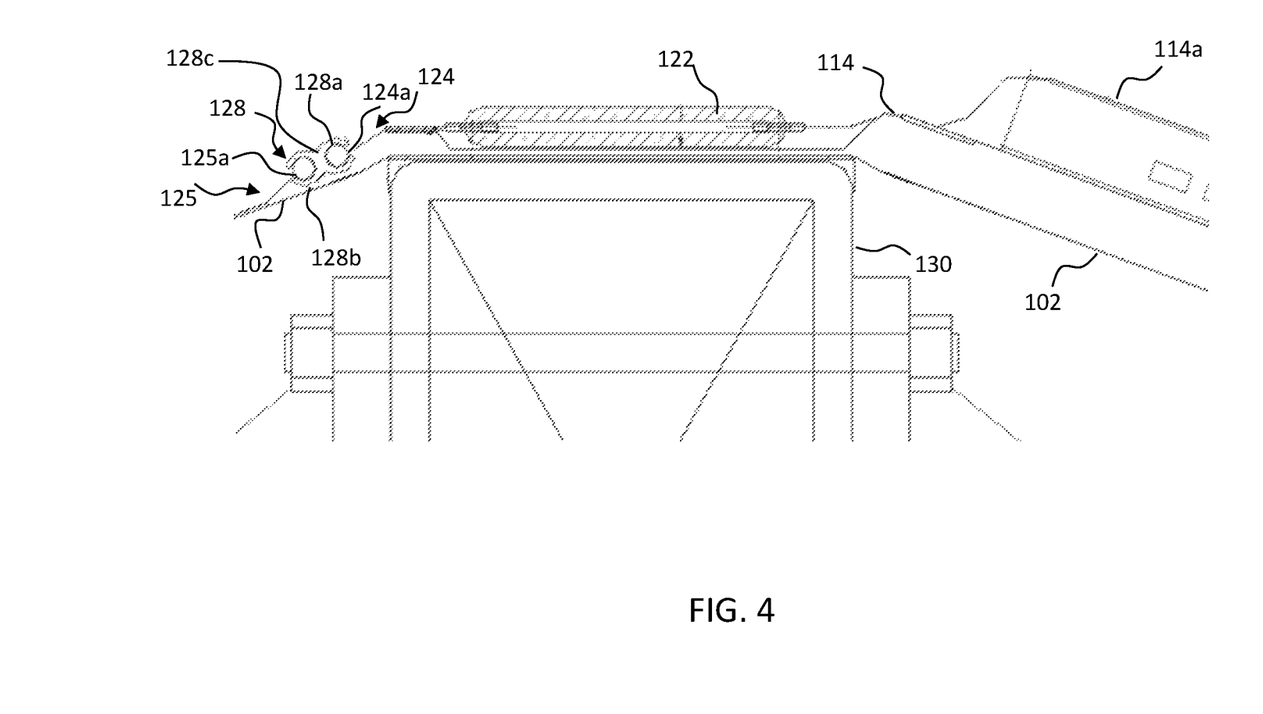
FIG. 4 depicts a cross-sectional view of a portion of the system of FIG. 1, in accordance with some embodiments.

FIG. 4 depicts a cross-sectional view of a portion of system 100, in accordance with some embodiments. In particular, FIG. 4 shows how flexible membrane 114 can be coupled to flexible underlying membrane 102 using keder rail 128. Keder rail 128 includes two C-shaped portions 128a and 128b, arranged back to back and meeting at center portion 128c. C-shaped portions 128a and 128b may be sized and shaped appropriately to receive, respectively, keder 124 and keder 125. Keder flag 125a of keder 125 may be heat welded or otherwise permanently affixed to flexible underlying membrane 102. Accordingly, flexible membrane 114 may be installed on flexible underlying membrane 102 by slidably receiving keder 124 and keder 125.

A section of flexible PV array 110 may be dedicated to providing space for electronics required for operation and transfer of power from flexible PV panels 112 to a load, such as junction boxes, optimizers, and/or wiring, for example. As depicted in FIG. 4, for PV membrane 114 can include pocket 114a that can retain various electronic components and protect them from the elements.

Although FIG. 4 depicts strip 122 installed over structural support 130, it should be understood that flexible PV arrays 110 may be installed at any location on flexible underlying membrane 102, and that the systems and methods disclosed here do not rely on the locations of, or indeed the existence of, an underlying rigid support structure.

Figure 5:
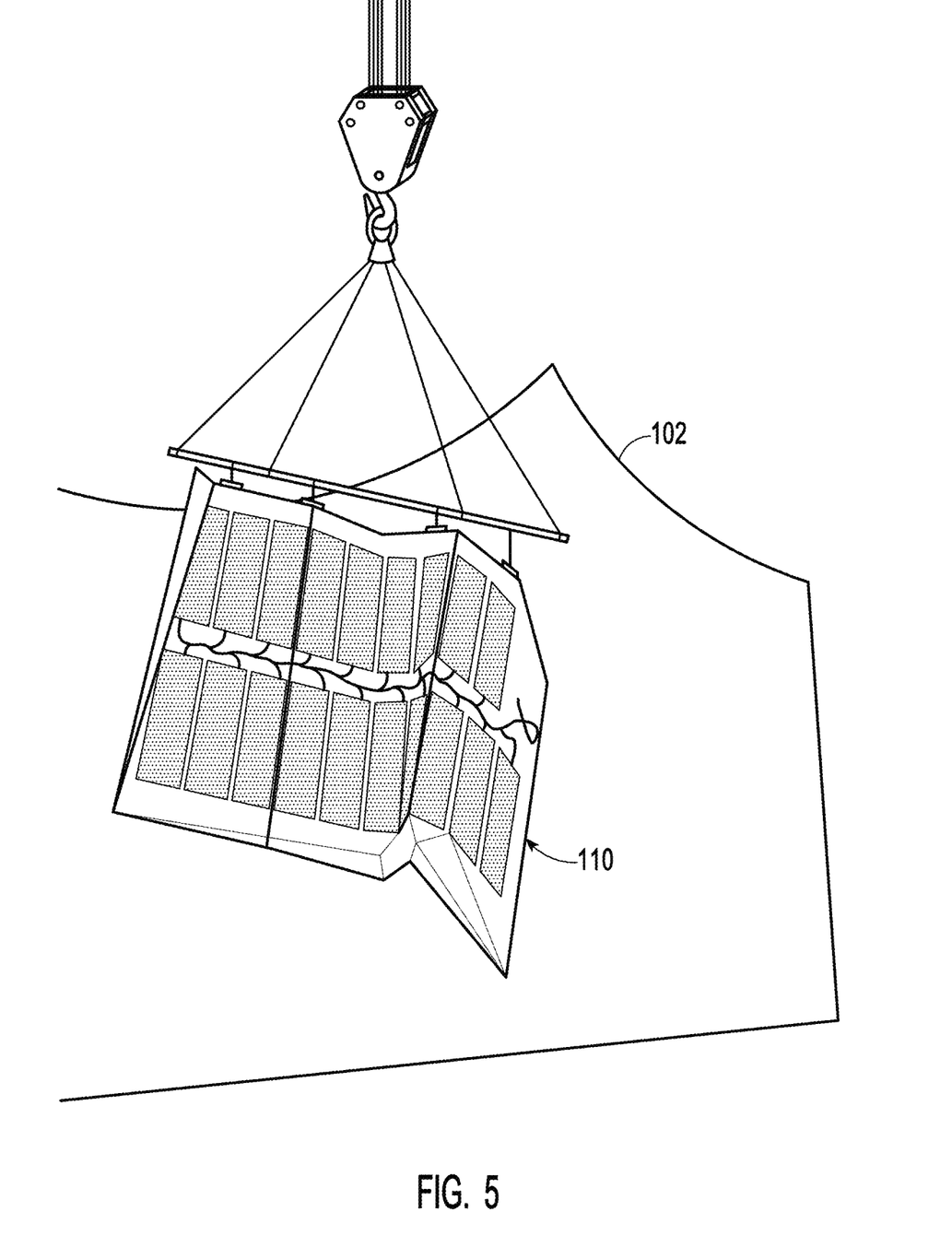
FIG. 5 depicts a perspective view of a flexible PV array being installed on a flexible underlying membrane, in accordance with various embodiments.

FIG. 5 depicts a perspective view of flexible PV array 110 being installed on flexible underlying membrane 102, in accordance with various embodiments. In particular, FIG. 5 shows flexible PV array 110 being lifted into position above flexible underlying membrane 102. The installation may proceed by attaching keders 125 to appropriate locations on flexible underlying membrane 102 (locations that closely approximate the shape flexible PV array 110 will assume when placed on flexible underlying membrane 102), sliding keder rails over keders 125 and 124, and lacing together grommets 126.

Figure 6:
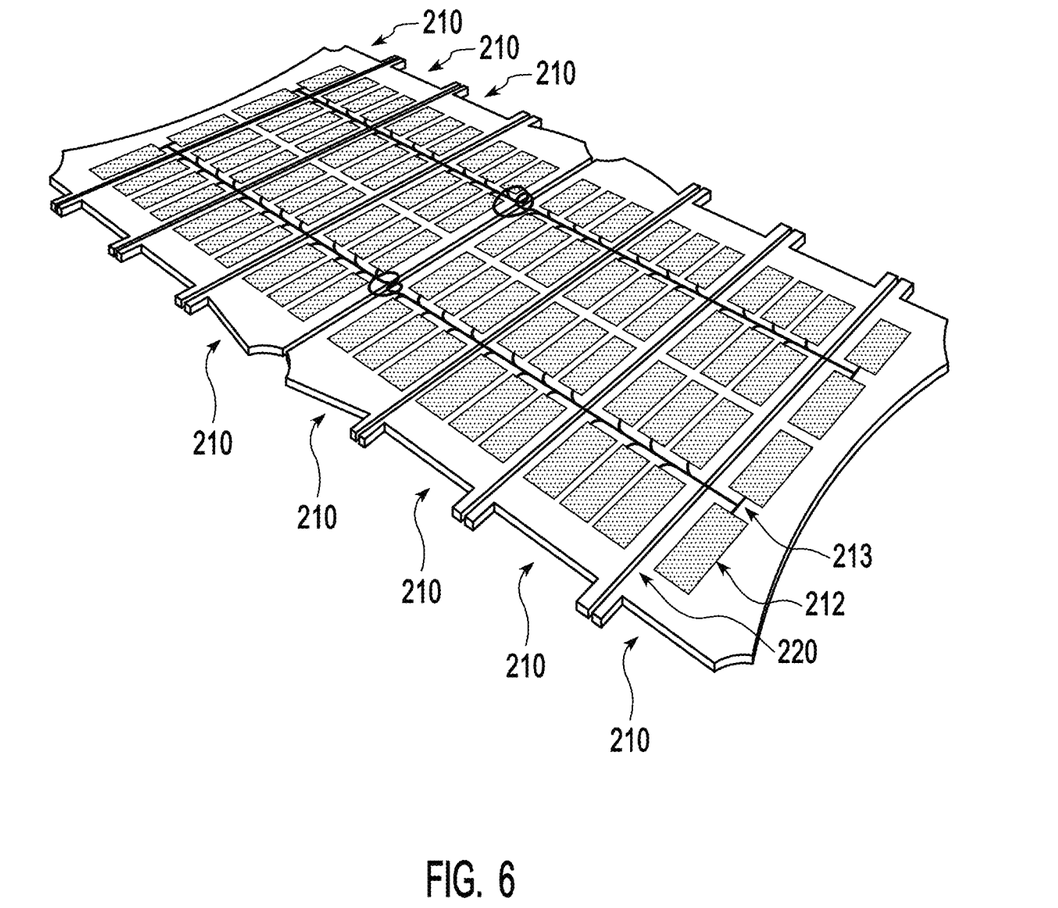
FIG. 6 depicts a perspective view of several flexible PV arrays configured for installation without an underlying membrane, in accordance with some embodiments.

FIG. 6 depicts a perspective view of several flexible PV arrays 210, in accordance with some embodiments. Flexible PV arrays 210 are depicted fully assembled with flexible PV panels 212, wiring 213, and tensioning members 220 coupled to PV membrane 214 (which may correspond to flexible PV panels 112, wiring 113, tensioning members 120 and PV membrane 114, for example). Wiring 213 is managed by passing wires through loops of fabric that organize the wire runs and retain wiring 213 against flexible PV arrays 210. Flexible PV arrays 210 are fully assembled and ready for transportation to an installation site to be installed.

Figure 7:
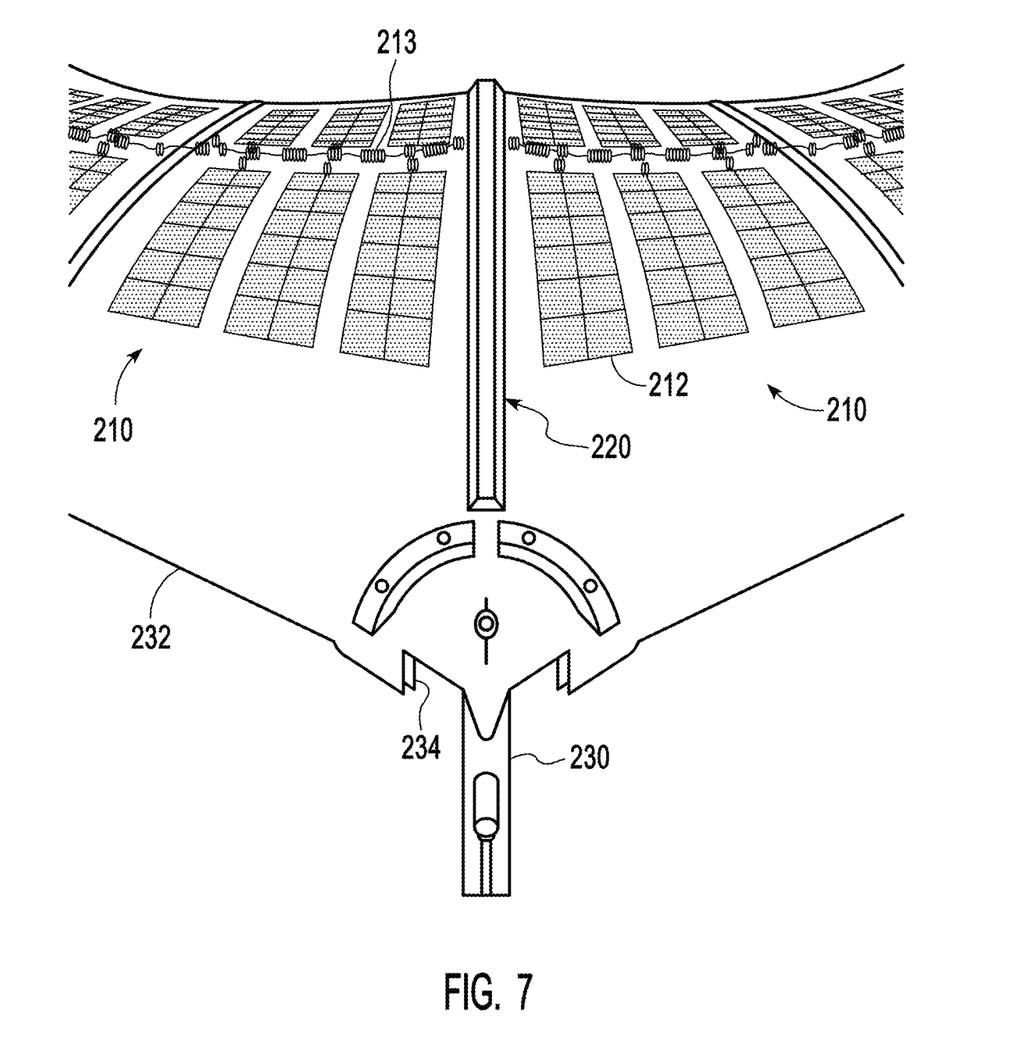
FIG. 7 shows a perspective view of another flexible PV system, in accordance with various embodiments.

Flexible PV arrays 210 may differ from flexible PV arrays 110 in that they include cable pockets 232 for receiving structural members (e.g., structural members 230 shown in FIG. 7). By virtue of including cable pockets 232, flexible PV arrays 210 may be seamed together using tensioning members 220, for example, and coupled to an underlying support structure that can alleviate the need for an underlying flexible membrane. That is, flexible PV arrays 210 may, themselves, form a flexible membrane structure.

FIG. 7 shows a perspective view of flexible PV system 200, in accordance with various embodiments. Flexible PV system 200 includes flexible PV arrays 210, including flexible PV panels 212 mounted on PV membrane 214. Unlike flexible PV arrays 110, flexible PV arrays 210, are not mounted on a flexible underlying membrane. Instead, tensioning cables 234, coupled to structural support 230, can be received in cable pockets 232 of PV membrane 214. Tensioning cables 234, in conjunction with support 230, can be utilized to produce tension on, and give support to, PV membrane 214.

Figure 8:
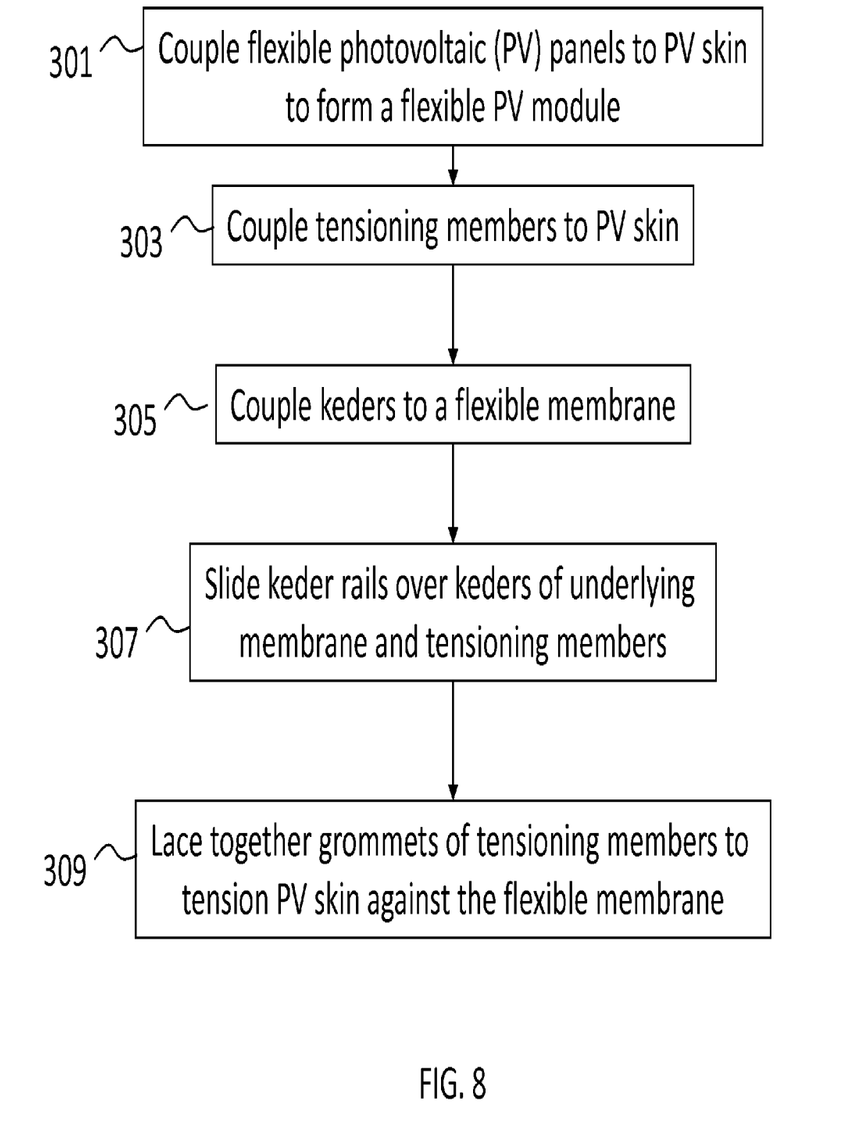
FIG. 8 shows a flowchart of a method for applying flexible PV panels to flexible underlying membranes, in accordance with various embodiments.

FIG. 8 shows a flowchart of method 300 for applying flexible PV panels to flexible underlying membranes, in accordance with various embodiments. Method 300 begins at step 301 in which flexible PV panels are coupled to a PV membrane to form a flexible PV array (e.g., flexible PV panel 112, PV membrane 114, and flexible PV array 110 of FIG. 1). The flexible PV panels may be coupled to the PV membrane with an adhesive, such as a butyl or acrylic foam tape type adhesive, for example. In some embodiments, to promote bonding between the flexible PV panels and the PV membrane, the PV membrane may be laid upon a vacuum table during the coupling process to ensure that the PV membrane is flat before attaching the flexible PV panels. In some embodiments, pressure may be applied to the flexible PV panels after contacting them to the PV membrane to promote bonding.

At step 303, tensioning members can be coupled to the PV membrane. Tensioning members (e.g., tensioning members 120 of FIG. 3) can include a PV membrane grommet strip, a keder grommet strip, and main strip, and a keder. In some embodiments, tensioning member 120 can be formed by heat welding the PV membrane grommet strip, the keder grommet strip, and the keder to the main strip. In other embodiments, a single strip of material can be folded over at or close to the location of the welded couplings to result in the PV membrane grommet strip, keder grommet strip, and main strip with the keder heat welded to the keder grommet strip. The PV membrane grommet strip can be coupled to the PV membrane using a heat welding process or the like. At step 305, keders can be coupled to the flexible underlying membrane using a heat welding process or the like.

At step 307, keder rails can be slidably attached to the keders of the tensioning members and the flexible underlying membrane. The keder rails (e.g., keder rails 128 of FIG. 4) may be extruded parts that have one degree of freedom when slidably attached to the keders.

At step 309, grommets provided in the PV membrane grommet strip and the keder grommet strip of each tensioning member can be laced together. Lacing the grommets together can tension the flexible PV arrays against the flexible underlying membrane. Any suitable rope, cable, or the like, may be used to lace the grommets together.

While there have been systems and methods for attaching flexible solar panels to flexible underlying membranes, it is to be understood that many changes may be made therein without departing from the spirit and scope of the invention. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The described embodiments of the invention are presented for the purpose of illustration and not of limitation.

What is claimed is:

1. A photovoltaic ("PV") system, comprising:
   a flexible underlying membrane;
   at least one flexible PV array, comprising at least one tensioning member, each of the at least one tensioning members permanently affixed to an edge of one of the flexible PV arrays; and
   a first keder rail slidably attached to:
      a first keder permanently affixed to the flexible underlying membrane; and
      a second keder permanently affixed to a first tensioning member of the at least one tensioning member.

2. The PV system of claim 1, further comprising:
   a second keder rail slidably attached to:
      a third keder permanently affixed to the flexible underlying membrane; and
      a fourth keder permanently affixed to a second tensioning member of the at least one tensioning member.

3. The PV system of claim 1, wherein the flexible underlying membrane has a doubly curved topology.

4. The PV system of claim 3, wherein at least one keder rail follows geodesic lines of curvature on a surface of the flexible underlying membrane.

5. The PV system of claim 1, the first tensioning member comprising:
   a keder grommet strip permanently affixed to the second keder;
   a PV membrane grommet strip permanently affixed to an edge of the flexible PV array;
   a plurality of grommets on each of the keder grommet strip and the PV membrane grommet strip; and a rope or a cable laced through the plurality grommets, which provides tension the flexible PV array when tightened.

\* \* \* \* \*